(12) United States Patent
Latino et al.

(10) Patent No.: US 10,492,326 B2
(45) Date of Patent: Nov. 26, 2019

(54) AISLE CONTAINMENT SYSTEM FOR DATA CENTER

(71) Applicant: Eaton Intelligent Power Limited, Dublin (IE)

(72) Inventors: Richard M. Latino, Sterling, MA (US); David C. Nelson, Princeton, MA (US)

(73) Assignee: Eaton Intelligent Power Limited, Dublin (IE)

( * ) Notice: Subject to any disclaimer, the term of this patent is extended or adjusted under 35 U.S.C. 154(b) by 3 days.

(21) Appl. No.: 15/898,326

(22) Filed: Feb. 16, 2018

(65) Prior Publication Data

US 2019/0261533 A1 Aug. 22, 2019

(51) Int. Cl.
| | |
|---|---|
| *H05K 7/00* | (2006.01) |
| *H05K 7/14* | (2006.01) |
| *H05K 7/20* | (2006.01) |
| *H05K 7/18* | (2006.01) |

(52) U.S. Cl.
CPC ......... *H05K 7/1452* (2013.01); *H05K 7/1447* (2013.01); *H05K 7/18* (2013.01); *H05K 7/20836* (2013.01)

(58) Field of Classification Search
None
See application file for complete search history.

(56) References Cited

U.S. PATENT DOCUMENTS

| | | | | |
|---|---|---|---|---|
| 5,016,764 | A * | 5/1991 | Bauer | A47B 47/04 211/189 |
| 5,125,201 | A * | 6/1992 | Pieters | E04B 2/822 52/238.1 |
| 2010/0186326 | A1* | 7/2010 | Cummings | E04B 2/7422 52/239 |
| 2011/0108207 | A1* | 5/2011 | Mainers | H05K 7/20745 160/87 |
| 2013/0025220 | A1* | 1/2013 | Yu | E04C 2/52 52/220.7 |
| 2013/0160271 | A1* | 6/2013 | Krietzman | H05K 13/04 29/428 |
| 2017/0181312 | A1* | 6/2017 | Chen | H05K 7/1489 |
| 2018/0132385 | A1* | 5/2018 | Gosselin | H05K 7/20745 |
| 2018/0168064 | A1* | 6/2018 | Gustaferro | H05K 7/1488 |

* cited by examiner

*Primary Examiner* — Courtney L Smith
*Assistant Examiner* — Rashen E Morrison
(74) *Attorney, Agent, or Firm* — Stinson LLP

(57) ABSTRACT

An aisle containment system includes a framework and a panel for the framework. The panel is removable attachable to the framework by mating first and second interference fit connectors.

20 Claims, 10 Drawing Sheets

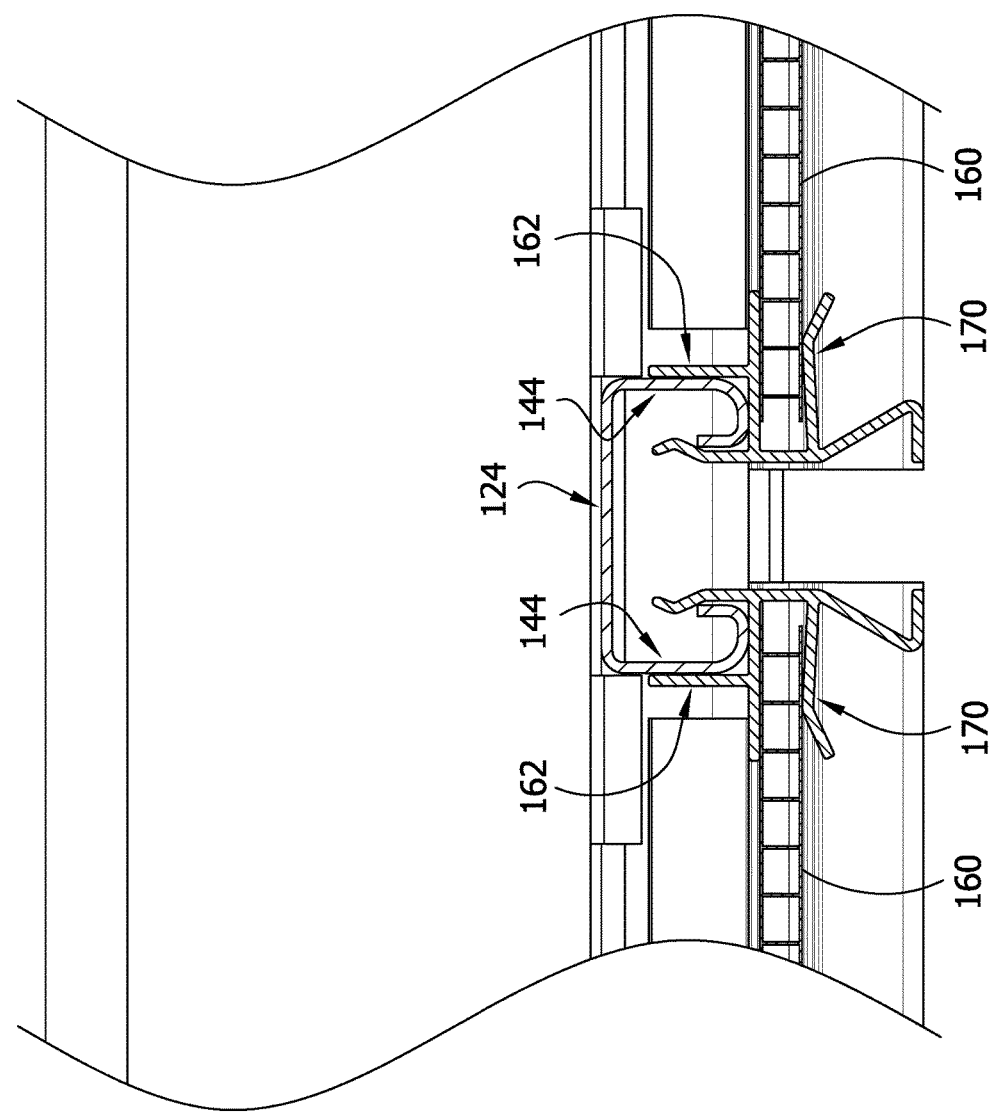

AISLE CONTAINMENT SYSTEM FOR DATA CENTER

FIELD OF THE DISCLOSURE

The present disclosure generally relates to an aisle containment system for a data center.

BACKGROUND OF THE DISCLOSURE

Aisle containment systems in data centers seek to isolate the heated air exiting data center electronics from the ambient or cooled air in the data center. The data center equipment racks are normally positioned adjacent to one another to create rows of equipment racks. The rows of racks are further situated parallel to one another as to define alternating "hot" and "cold" aisles, where one aisle is bounded on each side by forward facing racks (cold aisle). The aisle(s) adjacent to the cold aisle are bounded on each side by rearward facing racks, creating "hot" aisles. As such the aisles alternate from hot to cold. Cooling air is supplied to the fronts of the racks whereby the air enters the racks and is expelled as heated exhaust air from the rear of the racks.

For example, it is typical to enclose the hot aisle(s) whereby the enclosed aisle space is isolated and attached to an enclosed air return path to the data center air conditioning equipment or for expulsion to the outside of the data center building. The usual embodiment of the return path is the space above the data center ceiling (however other return methods exist, such as ducting). The containment system that encloses the aisle is usually free standing and independent of the racks, although the system may be suspended from the ceiling or floor supported on posts. The cold aisle(s) may also be enclosed and isolated.

SUMMARY OF THE DISCLOSURE

In one aspect, an aisle containment system generally comprises a framework having opposing sides extending along a length of the framework to at least partially define an interior of the framework. The framework includes frame members defining a plurality of frames extending along the opposing sides. Each frame includes a first interference fit connector extending generally around perimeters thereof. At least one panel including a panel sheet, and a second interference fit connector extends generally around the panel sheet adjacent a perimeter thereof. The second interference fit connector is selectively mateable with the first interference fit connector to removably attach the at least one panel to a selected one of the frames.

BRIEF DESCRIPTION OF THE DRAWINGS

FIG. 10 is an enlarged cross-sectional view taken through the line 10-10 in FIG. 9.

DETAILED DESCRIPTION OF THE DISCLOSURE

Figure 1:
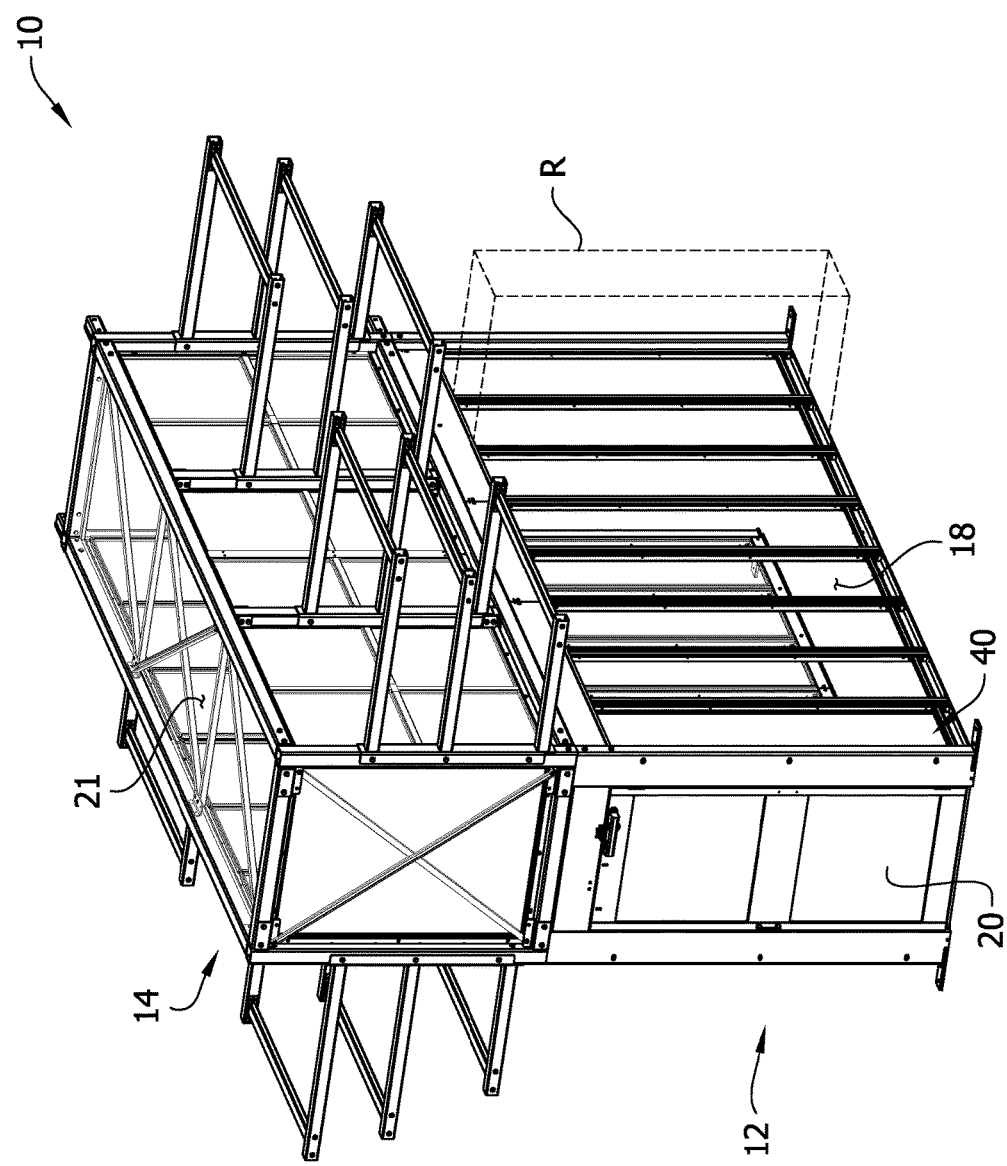
FIG. 1 is a perspective of an aisle containment system constructed according to the teachings of the present disclosure including a lower aisle framework and an upper plenum assembly.

Referring to FIG. 1, one embodiment of an assembled aisle containment system constructed according to the teachings of the present disclosure is indicated generally at reference numeral 10. The illustrated embodiment is configured as a "hot side" aisle containment system. It is understood that the teachings set forth herein apply equally to the construction of a "cold side" aisle containment system, and therefore, unless specifically pointed out herein, the aisle containment system may be a cold side aisle containment system. Many of the components of the aisle containment system may be modular, such that the aisle containment system can have various lengths.

Referring still to FIG. 1, the aisle containment system 10 comprises a lower aisle framework, generally indicated at 12, and an upper plenum assembly 14 on top of the lower aisle framework. The aisle framework 12 defines an elongate, box-like structure having opposing sides extending lengthwise of the framework, and a front and rear ends extending between the opposing sides. The sides and ends of the aisle framework 12 define an interior 18 of the aisle framework. One or more doors are provided at the front and/or rear ends of the aisle framework 12 (only a front door 20 is illustrated) to provide entry location(s) into the aisle containment system 10. The upper plenum assembly also defines an elongate, box-like structure having opposing sides extending lengthwise of the lower aisle framework. As explained in more detail below, the upper plenum assembly 14 defines an interior 21 in fluid communication with the interior 18 of the lower aisle framework 12.

Figure 2:
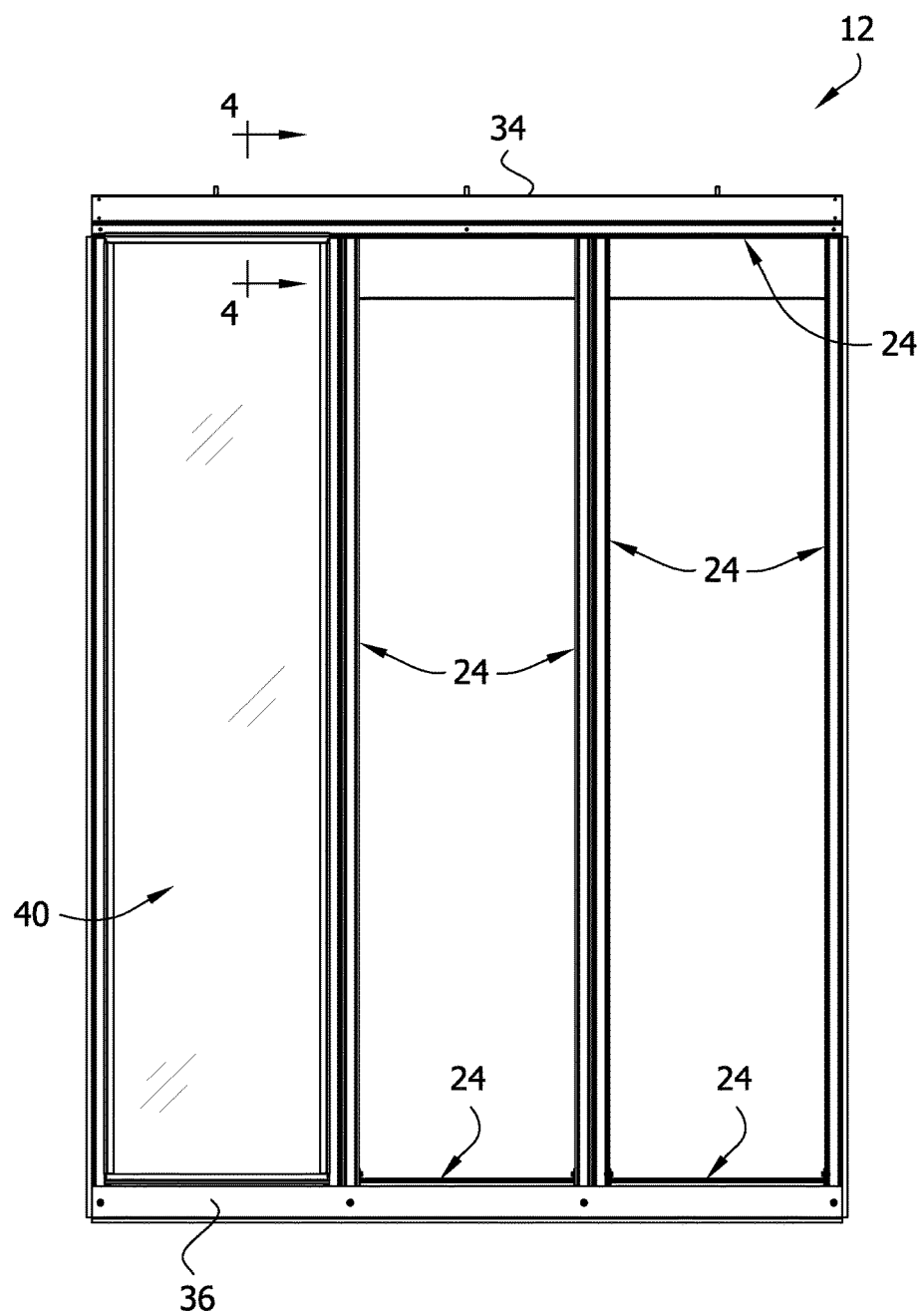
FIG. 2 is a rear, fragmentary elevational view of one side of the lower aisle framework showing an interior surface of the side of the lower aisle framework.
Figure 3:
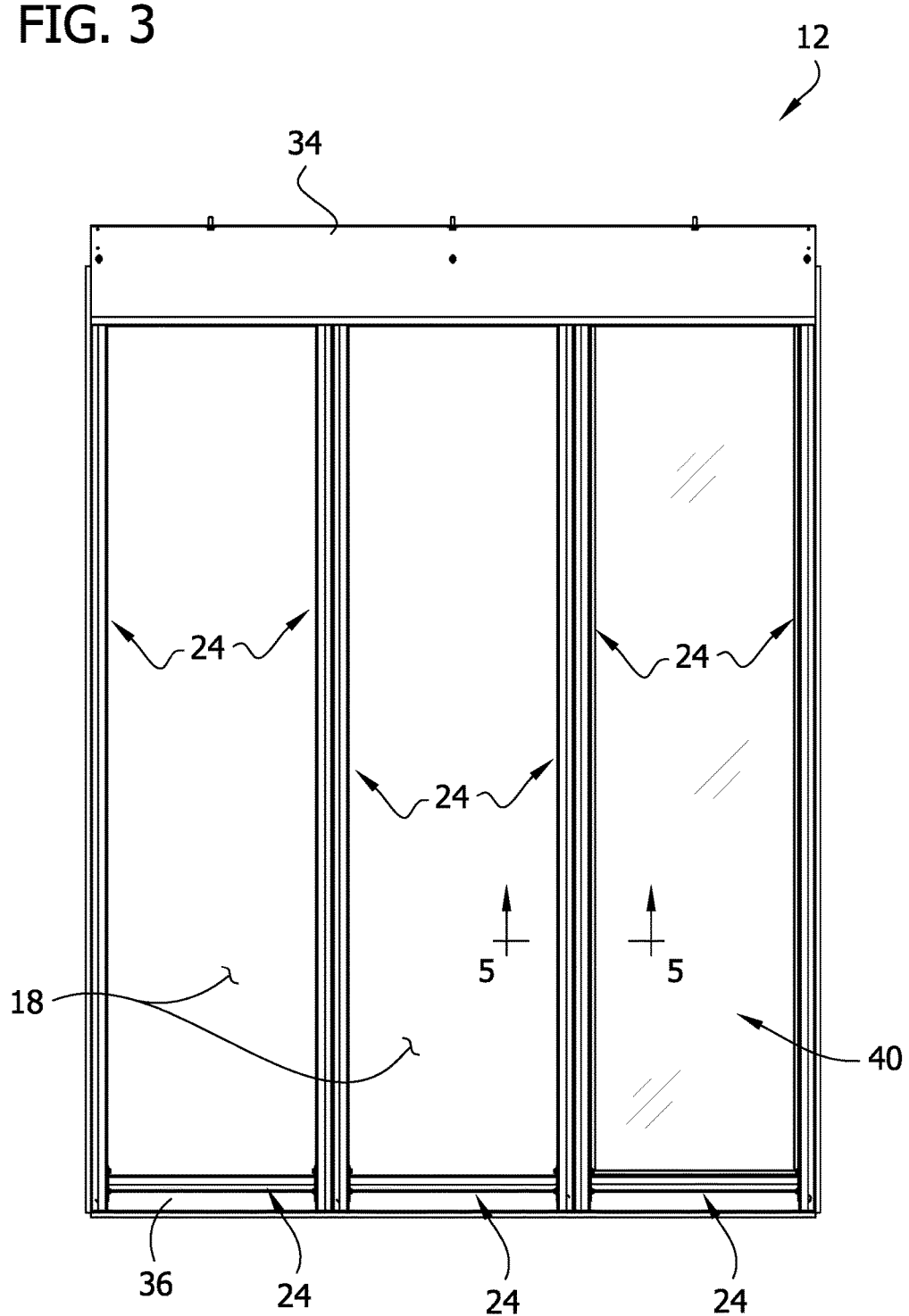
FIG. 3 is a front elevational view of FIG. 2 showing an exterior surface of the side of the lower aisle framework.

The opposing sides of the aisle framework 12 may be generally identical in structure. For purposes of clarity, the following description refers to one of the opposing sides of the aisle framework 12, a longitudinal portion of which is illustrated in FIGS. 2 and 3, with the understanding that the teachings apply equally to the other framework side. The framework side is defined by frame members, generally indicated at 24, including at least one upper horizontal frame member, at least one lower horizontal frame member (e.g., a plurality of lower frame members), and a plurality of vertical frame members extending between the upper and lower horizontal frame members. Together, the frame members 24 define a plurality of adjacent open docking frames (e.g., rectangular docking frames). In the illustrated embodiment, the framework side includes a single upper horizontal frame member 24 spanning across upper ends of the vertical frame members, although in other embodiments the framework side may include a plurality of upper frame members, each extending between and interconnecting adjacent vertical frame members. In the illustrated embodiment, the framework side includes a plurality of lower frame members 24, each extending between and interconnecting adjacent vertical frame members, although in other embodiments the framework side may include a single lower horizontal frame member spanning across upper ends of the vertical frame members. Header and footer panels 34, 36, respectively, are attached to the docking frames are respective upper and lower ends of the framework 12. The framework may be of other configurations for forming the framework sides.

Figure 5:
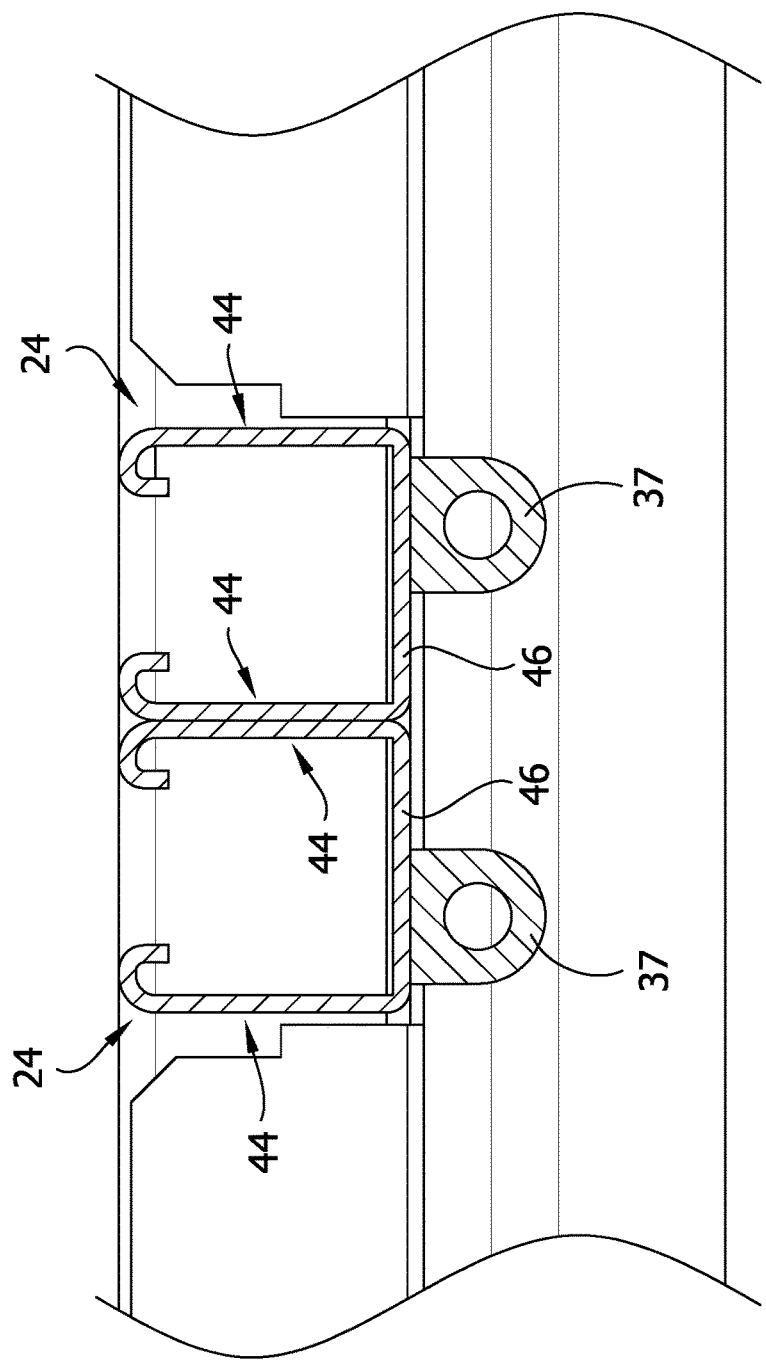
FIG. 5 is an enlarged cross-sectional view taken through the line 5-5 in FIG. 3.

In the illustrated embodiment, each open docking frame has an exterior surface (FIG. 3) defining a rack dock or rack bay. As shown in FIG. 5, a seal or gasket 37 is attached to the exterior surface of each docking frame to form a sealed junction with the equipment rack R (FIG. 1) such that hot air in the rack that is heated by the equipment in the rack (e.g., servers and other electronic devices) exits the rear of the rack and enters the interior 18 of the lower aisle framework 12. From the interior 18 of the lower aisle framework 18, the hot air enters the interior 21 of the upper plenum assembly 14 and flows outside the data center, as is generally known. It is common for data centers to have docking frames that are not populated by equipment racks R, due to rack servicing and/or to provide future expansion space for a growing data center. In the illustrated embodiment, each docking frame is configured to form a removable connection with a panel blank, generally indicated at 40, when there is an absence of a rack R to maintain aisle pressure within the interior 18.

As explained in more detail below, blanking panels 40 are selectively and removably attachable to the docking frames (i.e., the frame members 24) by an interference fit connection. In general, and explained in more detail below, the blanking panels 40 include interference fit connectors that are mateable with interference fit connectors of the docking frames to form the interference fit connections.

Figure 4:
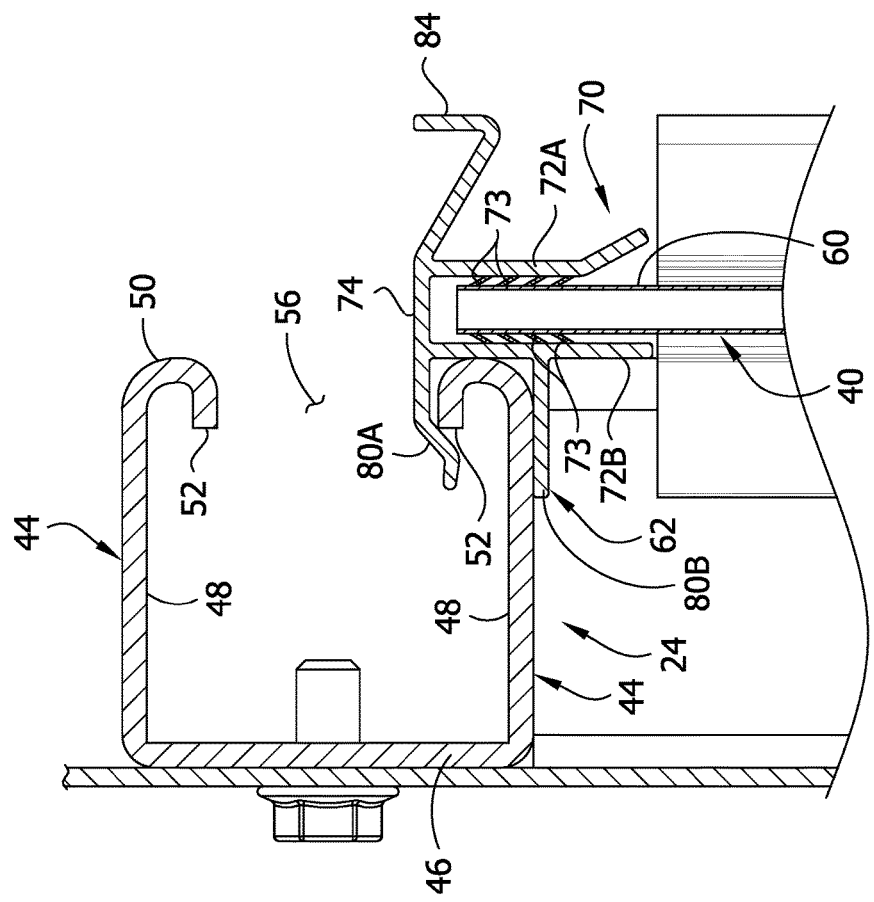
FIG. 4 is an enlarged cross-sectional view taken through the line 4-4 in FIG. 2.

In the illustrated embodiment, shown best in FIG. 4, the frame members 24 defining each docking frame comprises a channel strut. Each channel strut has a generally C-shape cross section and includes opposing side arms, generally indicated at 44, extending from a base wall 46. Each side arm includes a side wall 48 extending outward from the base wall 46, a flange 50 extending inward from the side wall, and a depending lip 52 extending from the upper flange toward the base wall and defining a longitudinal slot 56 of the channel strut. In the illustrated embodiment, the channel struts 24 are oriented such that the side arms 44 extend into and are accessible within the interior 18 of the lower aisle framework 12. It is understood that the channel struts 24 may be oriented such that the side arms 44 extend away from the interior 18 and are accessible outside the lower aisle framework 12. In general, one or both of the side arms 44 of each channel strut 24 constitutes a first interference fit connector (e.g., a male interference fit connector) configured to form an interference fit with one of the blanking panels 40. It is understood that in other embodiments, the frame members of the lower aisle framework 12 may include of other types of structural components, other than channel struts, having other types of interference fit connectors (e.g., male or female interference fit connectors) configured to form an interference fit with the blanking panels. The illustrated first interference fit connector 44 includes four interference fit connector components, each one adjacent one side of the docking frame and extending substantially continuously along the length of the corresponding side. In another embodiment, the first interference fit connector components may be discontinuous along the sides of the docking frame, such that the connector components are spaced apart from one another along the corresponding side of the docking frame.

Figure 6:
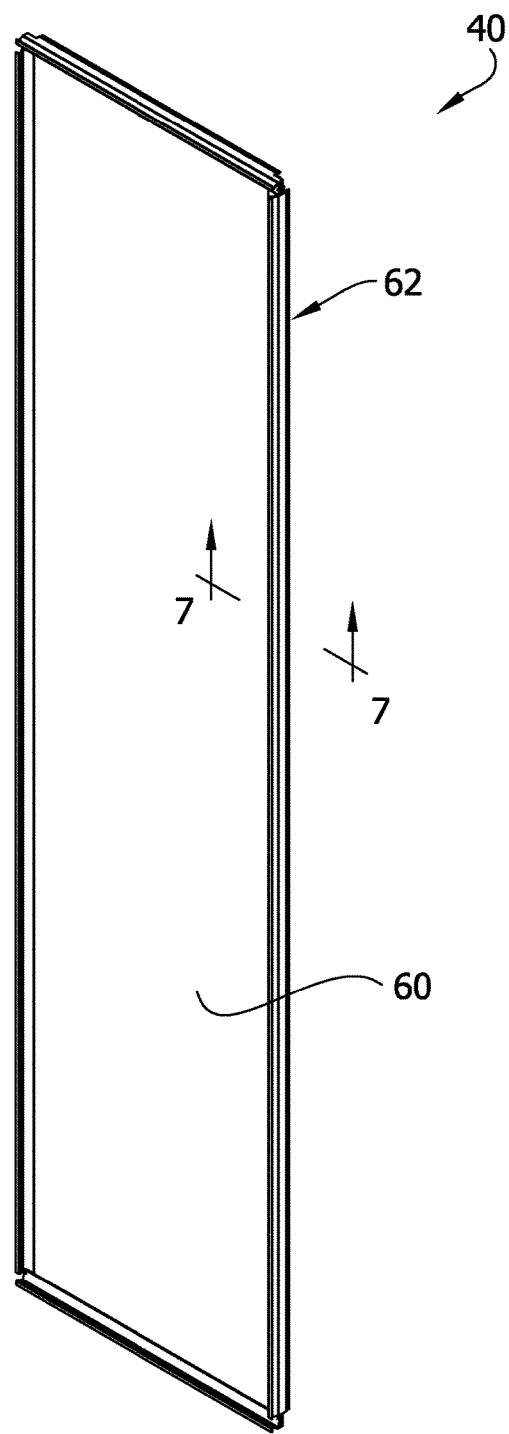
FIG. 6 is an enlarged perspective of one blanking panel.
Figure 7:
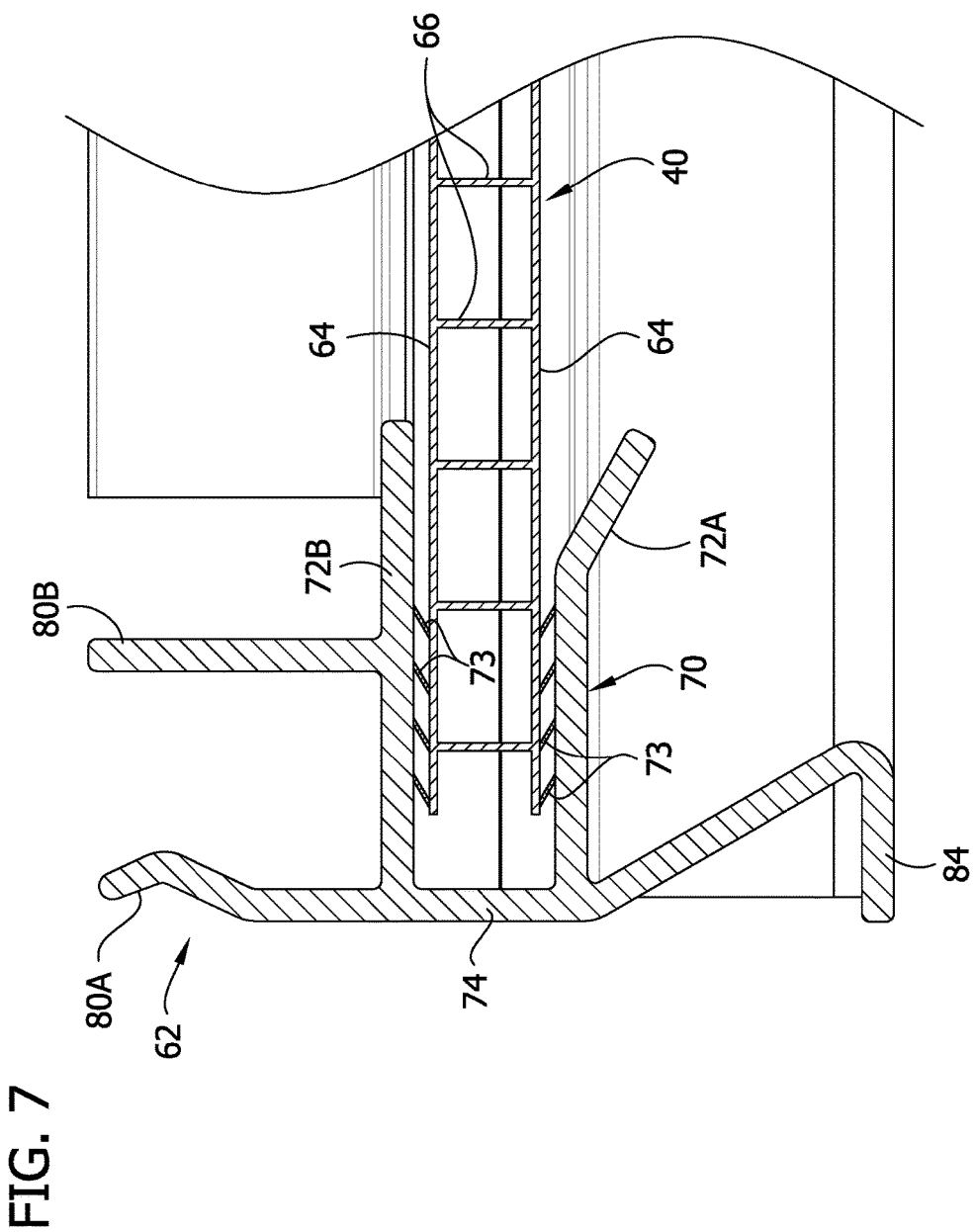
FIG. 7 is an enlarged cross-sectional view taken through the line 7-7 in FIG. 6.

Referring to FIGS. 4, 6, and 7, each blanking panel 40 includes a panel sheet 60 and a second interference fit connector, generally indicated at 62. The panel sheet 60 may be generally transparent. The panel sheet 60 may include two or more walls 64 (e.g., two panes) and cross ribs 66 received between the walls for structural integrity. The walls 64 and the ribs 66 may be formed from a polymer material, such as polycarbonate or other material. In the illustrated embodiment, the second interference fit connector 62 is joined to a panel sheet frame, generally indicated at 70, which is in turn attached to the panel sheet 60. Together, in the illustrated embodiment the second interference fit connector 62 and the panel sheet frame 70 constitute a connecting frame, although it is understood that in other embodiments the second interference fit may attached to the sheet panel in other ways, such as by adhesive or in other ways, and the blanking panel may not include the panel sheet frame. The panel sheet frame 70 is channel-shaped and comprises opposing frame arms 72A, 72B extending outward from a lateral frame wall 74 to define a slot sized and shaped to receive an edge margin of the panel sheet 60 to attach the panel sheet frame to the panel sheet. In the illustrated embodiment, at least one of the frame arms 72A is resiliently deflectable when the panel sheet 60 is inserted into the slot to form an interference fit, and more particular a compression fit, between the panel sheet and the panel sheet frame 70. In the illustrated embodiment, a flexible seal (e.g., seal flaps 73 or other type of seal) in the panel sheet frame 70 engages the panel sheet 60 generally adjacent the perimeter of the panel sheet. The seal flaps 73 enhance retention of the panel sheet 60 in the panel sheet frame 70 and/or inhibit air leakage around the perimeter of the panel sheet. The seal flaps 73 or other seal may be co-extruded with the panel sheet frame 70 or otherwise received therein to form the seal between the panel sheet 60 and the panel sheet frame. The panel sheet frame 70 may be secured to the panel sheet 60 in other ways in other embodiments.

The second interference fit connector 62 of the blanking panel 40 extends outward from the panel sheet 60 adjacent the perimeter of the panel sheet (e.g., the second interference fit connector 62 extends perpendicular to the panel sheet frame 70). In the illustrated embodiment, the second fit connector 62 includes opposing connector arms 80A, 80B extending outward from a connector base, which in the illustrated embodiment the connector base is defined by one of the frame arms, such as a generally rigid frame arm opposing the resiliently deflectable frame arm. Accordingly, the illustrated second fit connector 62 has a generally channel shape defining a connector slot that is sized and shaped to receive the first interference fit connector 44 therein to form the interference fit. Thus, the second fit connector 62 constitutes a female interference fit connector. In other embodiments, the second interference fit connector may be a male interference fit connector and the first interference fit connector may be a female interference fit connector. The illustrated second interference fit connector 62 includes four interference fit connector components, each one adjacent one side of the panel sheet 60 and extending substantially continuously along the length of the corresponding side. In another embodiment, the second interference fit connector components are discontinuous along the sides of the panel sheet, such that the connector components are spaced apart from one another along the corresponding side of the panel sheet 60.

When secured to the channel strut 24, one of the connector arms (i.e., the outer connector arm 80B) is outside the strut 24 and engaging the side arm 44, and the other connector arm (i.e., the inner connector arm 80A) extends through the slot 56 into the strut. At least one of the connector arms 80A, 80B is resiliently deflectable relative to the connector base and away from the other connector arm as one of the side arms of the channel strut 24 is being inserted into the connector slot. In the illustrated embodiment, the inner connector arm 80A includes a resiliently deflectable catch or detent that releasably engages the underside depending lip 52 of the corresponding side arm 44 of the channel strut 24 to releasable retain the interference fit. Accordingly, the inner connector arm 80A generally constitutes a cantilevered snap-fit arm that releasably snaps on the depending lip 52 of the side arm 44 of the channel strut 24. The snap-fit arm 80A includes a bead or barb or overhang that extends at least partly around the underside of the depending lip 52. More broadly, the second interference fit connector 62 may constitute a clip that clips on the frame member 24, e.g., clips on the first interference fit connector 44. When the blanking panel 40 is attached to the corresponding frame, the interference fit preferably creates a substantially gap-free perimeter seal to inhibit ambient or cool air from flowing into the interior 18.

A handle 84 (e.g., a pull handle) is connected to the second interference fit connector 62 to facilitate attachment and/or removal of the blank panel 40 to the frame member 24. The illustrated handle 84 is integrally formed with the second interference fit connector 62. The handle 84 extends outward in a direction opposite the second interference fit connector 62. The handle 84 is accessible by a user by gripping or pinching the handle with fingers. Pulling the handle 84 away from the strut 24 with sufficient force will disengage the second interference fit connector 62 from the channel strut 24 (e.g., the cantilever arm 80A will resilient deflect over the lip 52 and move out of the slot). It is understood that the handle 84 may not be integrally formed with the second interference fit connector 62. Moreover, the blanking panel 40 may not include the handle in other embodiments.

In an exemplary method of installing the blanking panel 40 on an aisle containment system 10, the blanking panel may be installed on a selected docking frame before removing a corresponding equipment rack R from the docking frame. Alternatively, the blanking panel 40 may be installed on an empty docking frame before docking the equipment rack R or after removing the equipment rack. The blanking panel 40 is pressed against the interior side of the docking frame such that the second interference fit connector 62 (e.g., the female snap-fit connector) of the blanking panel mates with the first interference fit connector 44 (e.g., the male snap-fit connector) of the docking frame. In the illustrated embodiment, the cantilevered snap-fit arm 80A enters the open slot 56 of the channel strut 24, resiliently deflects on the depending lip 52 of the arm, and then moves past the depending lip to an underside of the lip and partially rebounds. In one example, the cantilevered snap-fit arm 80A applies a constant compressive force on the depending lip 52. In the illustrated embodiment, for each blanking panel 40, all four second interference fit connectors 62 mate with the corresponding four first interference fit connectors 44.

Figure 8:
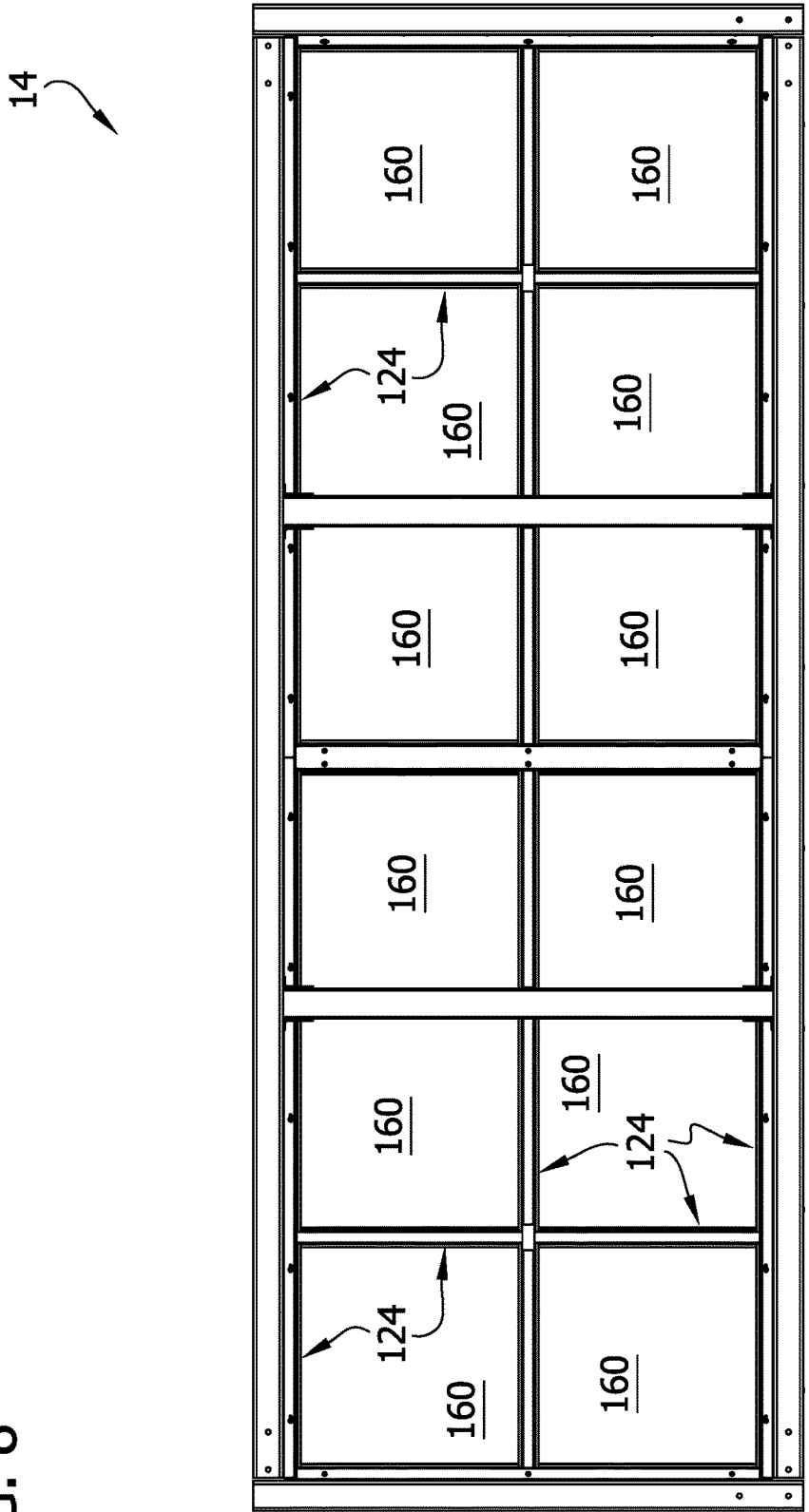
FIG. 8 is a front elevational view of one side of the upper plenum assembly showing an exterior surface of one side of the upper plenum assembly.
Figure 9:
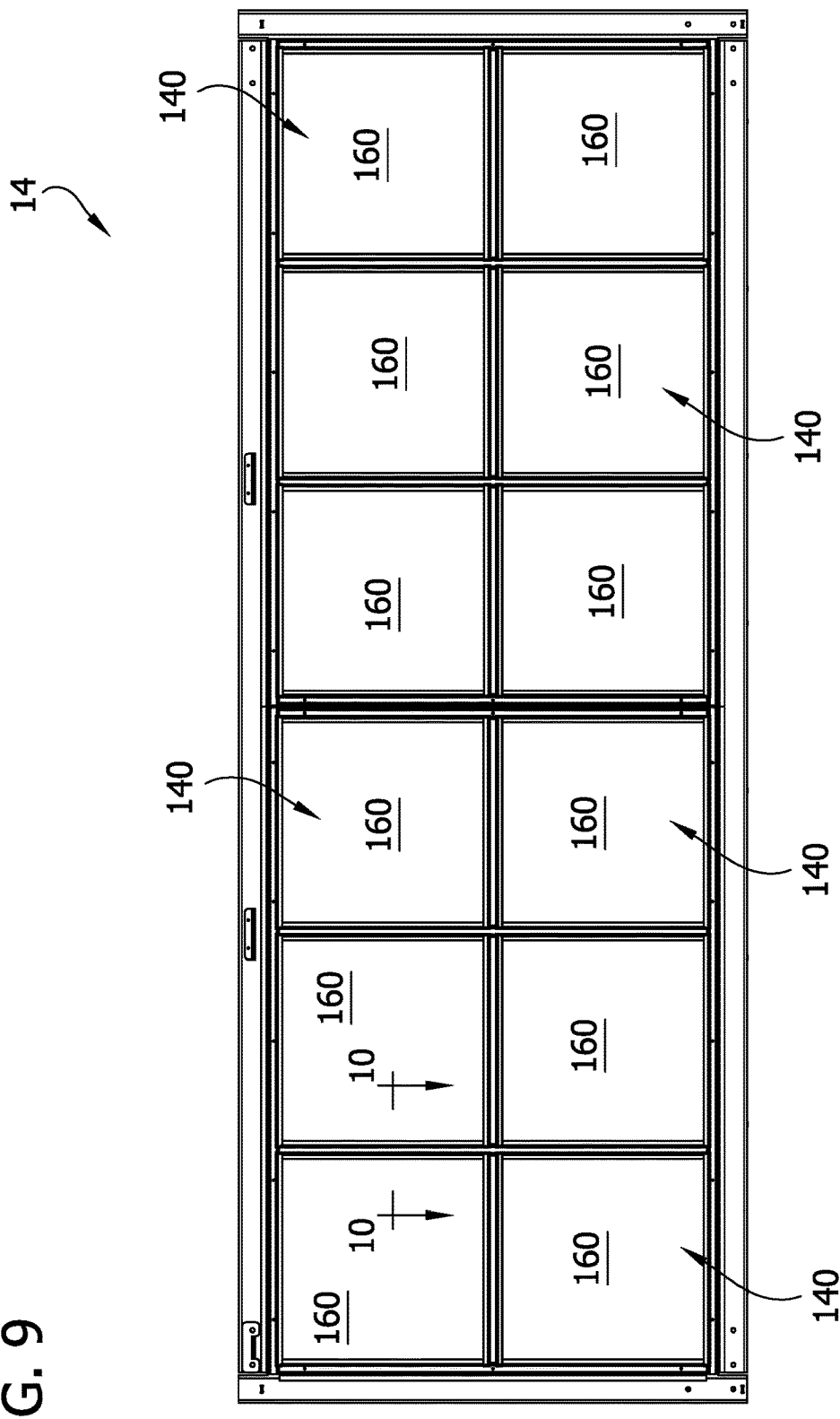
FIG. 9 is a rear elevational view of FIG. 8 showing an interior surface of the side of the upper plenum assembly.

Referring to FIGS. 1, 8, and 9, the upper plenum assembly 14 may be constructed similar to the lower aisle containment framework 12 so that plenum panels 140 are removably attached to a plenum framework to form the plenum assembly. The plenum assembly 14 defines a plurality of frame members 124 defining plenum frames similar to the docking frames of the aisle containment framework 12. The main difference between the plenum framework and the aisle containment framework 12 is the size and shape of the frames 124, 24 to which the respective plenum panels 160 and blanking panels 60 are attached. As can be seen from FIG. 10, each frame member 124 defining the plenum frames comprises a channel strut identical to the channel strut of the docking frame members 24, other than respective lengths. Each plenum panel includes a panel sheet 160, a second interference fit connector 162, a sheet frame 170, and a handle 184, each of which are identical to the corresponding components of the blanking panel 40 other than respective lengths. Accordingly, as can be understood, the plenum panels 140 are removably attached to the side arms 144 (first interference fit connector) of the channel struts 124 form interference fits with the blanking panels 140.

Modifications and variations of the disclosed embodiments are possible without departing from the scope of the invention defined in the appended claims.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions, products, and methods without departing from the scope of the invention, it is intended that all matter contained in the above description and shown in the accompanying drawings shall be interpreted as illustrative and not in a limiting sense.

What is claimed is:

1. An aisle containment system comprising:
  a framework having opposing sides extending along a length of the framework to at least partially define an interior of the framework, the framework including frame members defining a plurality of frames extending along the opposing sides, each frame having an open face in communication with the interior for accessing the interior of the framework through the open face, the open face having a plurality of perimeter sides forming a perimeter of the open face, each perimeter side of the open face defined by at least one of the frame members, each frame including a first interference fit connector extending generally along each perimeter side of the open face; and
  at least one panel including a panel sheet having side edge margins, and a second interference fit connector extending generally along each side edge margin of the panel sheet, wherein the second interference fit connector is selectively mateable with the first interference fit connector to removably attach the at least one panel to a selected one of the frames to close the open face of said selected one of the frames.

2. The aisle containment system set forth in claim 1, wherein one of the first and second interference fit connectors comprises a clip configured to clip on the other of the first and second interference fit connectors.

3. The aisle containment system set forth in claim 1, wherein the first and second interference fit connectors are configured to form a snap-fit connection when mated.

4. The aisle containment system set forth in claim 3, wherein one of the first and second interference fit connectors includes a resiliently deflectable snap-fit arm.

5. The aisle containment system set forth in claim 3, wherein the second interference fit connector includes a deflectable snap-fit arm configured to snap on the first interference fit connector.

6. The aisle containment system set forth in claim 5, wherein the second interference fit connector includes a second arm opposing the deflectable snap-fit arm and defining a slot in which the first interference fit connector is receivable.

7. The aisle containment system set forth in claim 6, wherein the frame members includes channel struts, each channel strut including a base and opposing side arms extending from the base, wherein at least one of the side arms defines the first interference fit connector.

8. The aisle containment system set forth in claim 7, wherein the each opposing side arm includes a side wall extending outward from the base wall, a flange extending inward from the side wall, and a depending lip extending from the upper flange toward the base wall and defining a longitudinal slot of the channel strut.

9. The aisle containment system set forth in claim 8, wherein the snap-fit arm is configured to snap on and engage the depending lip of at least one of the side arms.

10. The aisle containment system set forth in claim 1, wherein the at least one panel includes a panel sheet frame attached to the panel sheet adjacent the side edge margins thereof, wherein the second interference fit is connected to and extends outward from the panel sheet frame.

11. The aisle containment system set forth in claim 10, wherein second interference fit connector extends generally perpendicular to the panel sheet frame.

12. The aisle containment system set forth in claim 10, wherein the panel sheet frame includes opposing frame arms defining a slot sized and shaped to receive one of the edge margins of the panel sheet to attach the panel sheet frame to the panel sheet.

13. The aisle containment system set forth in claim 12, wherein at least one of the frame arms is resiliently deflectable when the panel sheet is inserted into the slot to form an interference fit.

14. The aisle containment system set forth in claim 1, wherein the at least one panel includes a handle for gripping to detach the at least one panel from the frame.

15. The containment system set forth in claim 14, wherein the handle and the second interference fit connector are on opposite sides of the panel sheet.

16. The aisle containment system set forth in claim 1, wherein the first interference connector extends toward the interior of the framework such that the first interference connectors are accessible within the interior of the framework.

17. The aisle containment system set forth in claim 1, wherein each of the open face has four perimeter sides and each of the panel sheet has four perimeter side edge margins.

18. The aisle containment system set forth in claim 1, wherein the framework is one of a plenum framework or an aisle containment framework and the at least one panel is one of a plenum panel or a blanking panel.

19. The aisle containment system set forth in claim 1, wherein the first interference fit connector is a male interference fit connector, wherein the second interference fit connector is a female interference fit connector configured to receive the male interference fit connector.

20. The aisle containment system set forth in claim 19, wherein the female interference connector includes a resiliently deflectable snap-fit arm.

\* \* \* \* \*